(12) United States Patent
Khwa et al.

(10) Patent No.: US 11,962,332 B2
(45) Date of Patent: Apr. 16, 2024

(54) ENCODER

(71) Applicant: Taiwan Semiconductor Manufacturing Company, Ltd., Hsinchu (TW)

(72) Inventors: Win-San Khwa, Taipei (TW); Hiroki Noguchi, Hsinchu (TW); Ku-Feng Lin, New Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/165,025

(22) Filed: Feb. 6, 2023

(65) Prior Publication Data

US 2023/0188159 A1 Jun. 15, 2023

Related U.S. Application Data

(63) Continuation of application No. 16/709,622, filed on Dec. 10, 2019, now Pat. No. 11,575,387.

(51) Int. Cl.
*H03M 7/00* (2006.01)
*G11C 11/16* (2006.01)
*H03K 19/20* (2006.01)
*H03M 7/16* (2006.01)

(52) U.S. Cl.
CPC .......... *H03M 7/16* (2013.01); *G11C 11/1673* (2013.01); *H03K 19/20* (2013.01)

(58) Field of Classification Search
CPC ...... H03M 1/16; G11C 11/1673; H03K 19/20
USPC ................................ 341/50, 97, 98, 67, 65
See application file for complete search history.

(56) References Cited

U.S. PATENT DOCUMENTS 7,164,802 B2 * 1/2007 Braica ..................... G06T 9/005
382/245

* cited by examiner

*Primary Examiner* — Peguy Jean Pierre
(74) *Attorney, Agent, or Firm* — Merchant & Gould P.C.

(57) ABSTRACT

An encoding system may be provided. The encoding system may comprise a first stage and a second stage. The first stage may be configured to receive a first input, decode the first input, and produce a first output comprising the decoded first input. The second stage may be configured to receive a second input, receive the first output from the first stage, and convert the first input and the second input from a first coding system to a second coding system based on the second input and the first output. The second stage may produce a second output comprising the converted first input and the converted second input.

20 Claims, 7 Drawing Sheets

ENCODER

PRIORITY CLAIM AND CROSS-REFERENCE

This application is a continuation of U.S. patent application Ser. No. 16/709,622 filed Dec. 10, 2019, now U.S. Pat. No. 11,575,387, the disclosure of which is hereby incorporated herein by reference in its entirety.

BACKGROUND

Magnetoresistive Random Access Memory (MRAM) is a non-volatile memory where data is stored in magnetic storage elements. In simple configurations, each cell has two ferromagnetic plates, each of which can hold a magnetic field, separated by a thin insulating layer. One of the plates is a permanent magnet set to a selected polarity and the other plate's field can be changed to match that of an external field to store a bit. Depending upon the field, the cell is either in the low ($R_L$) resistive state, which may represent a logic "1", or the high ($R_H$) resistive state, which may represent a logic "0".

Due to process variations, individual MRAM cells in an array can have different RH values (when programmed at RH) and different RL values (when programmed at RL). Process variations can result in an overlap in the resistance values for the high (RH) and low (RL) states, which can lead to read errors. This overlap is defined between $RH_{min}$ and $RL_{max}$.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
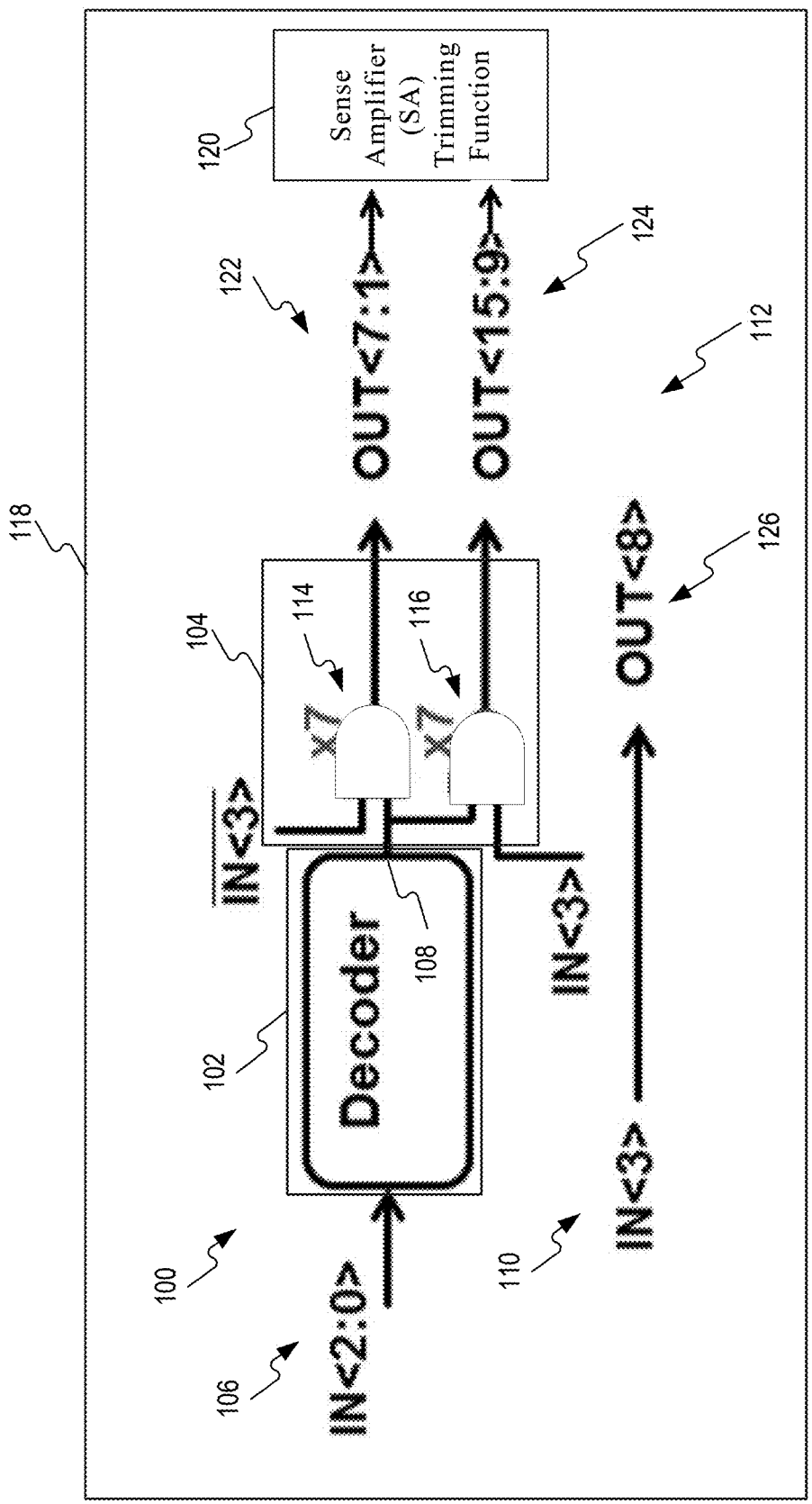
FIG. 1 is a block diagram that may illustrate an encoding system in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

MRAM is a non-volatile random access memory technology that uses magnetic storage elements to store data. MRAM stores data at memory cells having two superimposed layers of magnetic material separated by a thin insulating film, defining a magnetic tunnel junction ("MTJ element") of an MRAM cell. The two layers include a magnetic layer that is permanently magnetized in a fixed magnetic field alignment direction (this layer is referred to as a pinned layer), and a changeably-magnetized magnetic layer (this layer is referred to as a free layer). The changeably-magnetized magnetic layer can be magnetized in one of two orientations relative to the permanently magnetized layer. The two orientations are characterized by distinctly different serial resistances through the superimposed layers of the MTJ. The magnetic field orientation of the changeable layer can be aligned the same as that of the permanent magnet layer (parallel), or the magnetic field of the changeable layer can be aligned directly opposite to that of the permanent magnet layer (anti-parallel). The parallel alignment state has a relatively lower resistance and the anti-parallel alignment state has a higher resistance.

The two states of an MRAM cell are sensed from their relatively higher or lower resistances ($R_H$ and $R_L$), which represent different binary logic values of a bit stored in the memory. A reference voltage is applied to the MRAM cell, and the resulting cell current can be used to determine whether the cell is in the low resistance state or the high resistance state. For this purpose, a Sense Amplifier (SA) may be used to compare the cell current against a reference current.

In MRAM, unary (i.e., thermometer) code encoders may be used in trimming functions corresponding to the SA. Unary code encoders may be used in circuit design for their glitch reduction advantage. Conventional unary code encoders may not only occupy a significant portion of the SA area, but they may also induce large standby currents. The area unary code encoders consume in conventional systems may be large compared to other encoding types such as binary and gray encoding.

Embodiments of the disclosure may reduce the implementation area of the encoder and may also reduce standby currents. For example, embodiments of the disclosure may reduce the implementation area of the encoder by approximately 22% over conventional systems and may reduce the standby current of the encoder by approximately 15.3% over conventional systems. Encoders consistent with embodiments of the disclosure may be disposed in MRAMs and may be used in conjunction with SA trimming function of the MRAMs.

For example, embodiments of the disclosure may exploit a symmetric characteristic of the unary code in order to simplify implementation logic of embodiments of the disclosure. Furthermore, embodiments of the disclosure may reduce standby currents as a result of the simplified logic. In addition, by considering input distribution, embodiments of the disclosure may swap logic gate inputs to reduce the standby current of the more commonly occurring trim codes used in the SA trimming function of the MRAM.

Conventional SA trimming logic may occupy 43% of the total SA area. Moreover, the SA trimming logic may be highly symmetrical. As described in greater detail below, embodiments of the disclosure may use, for example, a 7:1 decoder (e.g., rather than a 15:1 decoder) along with logic gates to achieve logical equivalence. Because embodiments of the disclosure may use smaller decoders, the total SA area may be reduced. Accordingly, embodiments of the disclosure may reduce SA trimming logic area by approximately 22% over conventional systems without any trimming resolution penalty. In addition, embodiments of the disclosure may reduce SA trimming logic standby currents by approximately 15.3% over conventional systems while preserving, for example, "gray-to-thermal" characteristics. This standby current reduction may be accomplished because embodiments of the disclosure may use smaller decoders and may also swap logic gate inputs to favor default trim codes as will be described in greater detail below.

FIG. 1 is a block diagram that may illustrate an encoding system 100 in accordance with some embodiments of the disclosure. As shown in FIG. 1, encoding system 100 may comprise a first stage 102 and a second stage 104. First stage 102 may be configured to receive a first input 106, decode first input 106, and produce a first output 108 comprising the decoded first input. Second stage 104 may be configured to receive a second input 110, receive first output 108 from first stage 102, and convert first input 106 and second input 110 from a first coding system to a second coding system based on second input 110 and first output 108. Second stage 104 may produce a second output 112 comprising the converted first input 106 and the converted second input 110. Second stage 104 may comprise a first plurality of two input port AND gates 114 and a second plurality of two input port AND gates 116. Consistent with embodiments of the disclosure, encoding system 100 may be disposed in an MRAM 118 for example. Second output 112, for example, may correspond to trim codes used in a sense amplifier (SA) trimming function 120 of MRAM 118. Second output 112 may comprise a first portion 122, a second portion 124, and a third portion 126.

Figure 2A:
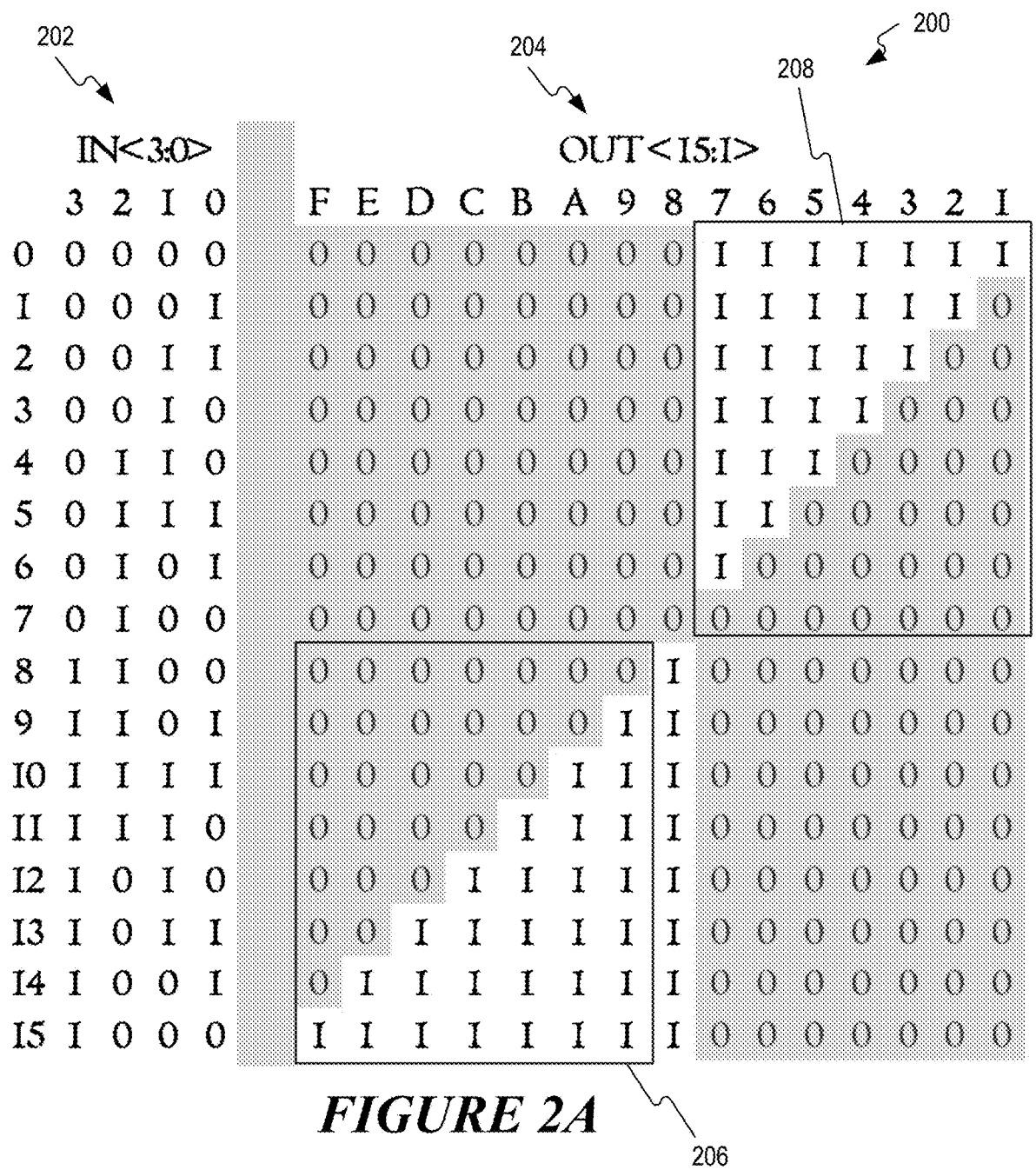
FIG. 2A and FIG. 2B illustrate a truth table in accordance with some embodiments.

FIG. 2A illustrates a truth table 200 in accordance with some embodiments of the disclosure. For example, input code 202 may be provided as input to encoding system 100 and output code 204 may be provided as an output by encoding system 100 in response to input code 202. Input code 202 in the example of FIG. 2A uses reflected binary (RB), or Gray code, which is an ordering of the binary numeral system such that two successive values differ in only one bit. While input code 202 may comprise Gray code as illustrated in FIG. 2A, embodiments of the disclosure are not limited to Gray code and may utilize other coding systems such as binary as input code 202. In addition, while output code 204 may comprise unary code as illustrated in FIG. 2A, embodiments of the disclosure are not limited to unary code and may utilize other coding systems such as other coding systems having a symmetric characteristic as output code 204. A symmetric characteristic may comprise a quality of a truth table in which a first block of the truth table may be the same as a second block of the truth table when the first portion is transposed upon the second portion by rotating it about a vertical and a horizontal axis and vice versa.

As shown in FIG. 2A, a symmetric characteristic of the unary code may exist. For example, the block in truth table 200 comprising rows 0 through 7 and columns F through 9 comprise all 0's. Similarly, the block in truth table 200 comprising rows 8 through 15 and columns 7 through 1 comprise all 0's. Also, the block in truth table 200 comprising rows 8 through 15 and columns F through 9 is the same as the block in truth table 200 comprising rows 0 through 7 and columns 7 through 1. Furthermore, column 3 of input code 202 is the same as column 8 of output code 204. Embodiments of the disclosure may exploit this symmetric characteristic of the unary code illustrated in FIG. 2A in order to simplify implementation logic of encoding system 100. Embodiments of the disclosure may use other symmetrical coding systems and is not limited to unary code.

A symmetric characteristic may exist in truth table 200. For example a first block 206 may be transposed upon a second block 208 by rotating first block 206 about a vertical axis comprising column 8 and then rotating first block 206 again about a horizontal axis between row 7 and row 8. Similarly, second block 208 may be transposed upon first block 206 by rotating second block 208 about the vertical axis comprising column 8 and then rotating second block 208 again about the horizontal axis between row 7 and row 8. After such transpositions, the two blocks are the same. Accordingly, truth table 200 may have a symmetric characteristic.

Figure 2B:
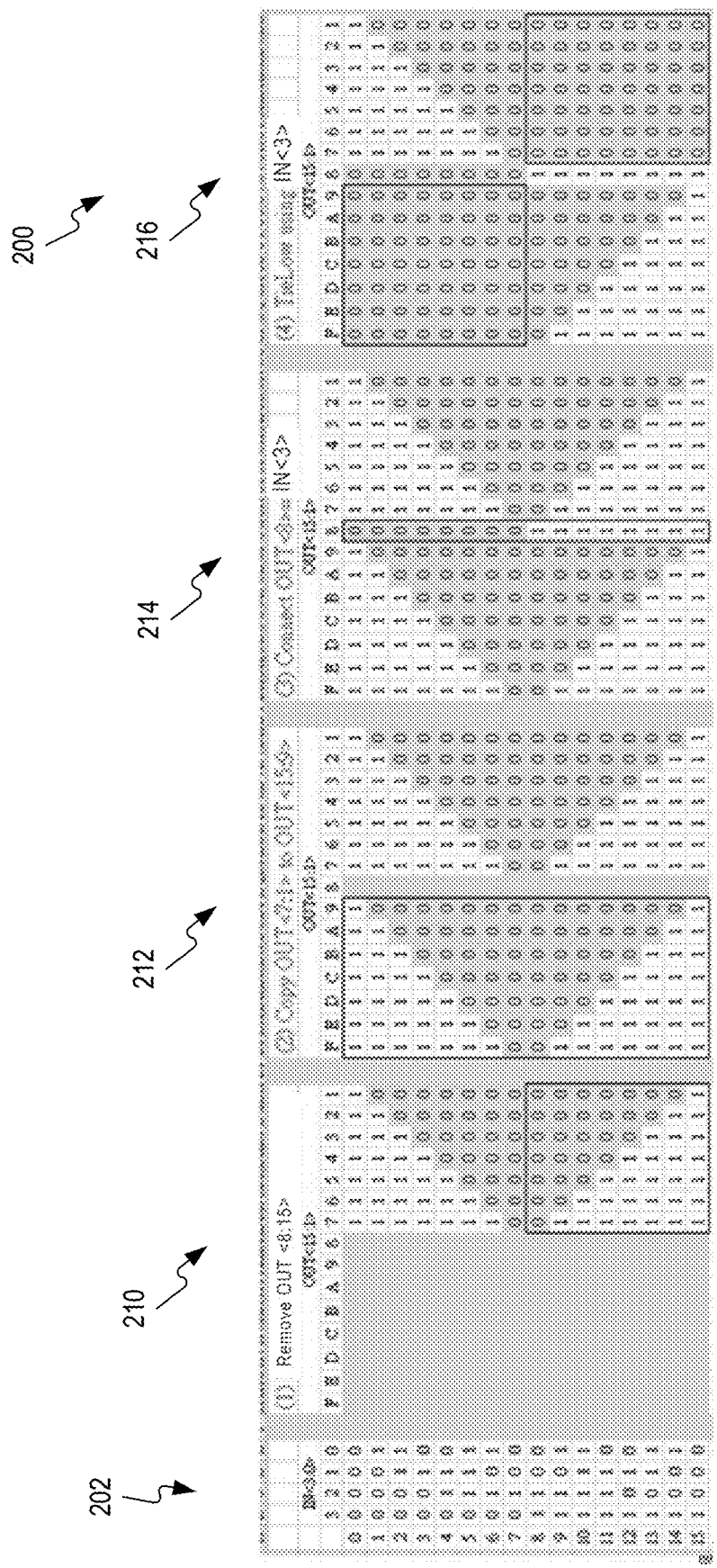

FIG. 2B illustrates how truth table 200 may be obtained in the context of replacing a 15:1 unary encoder with encoding system 100 in accordance with some embodiments of the disclosure. A 15:1 unary encoder may consume a large area and require a high standby current. Encoding system 100 in accordance with some embodiments of the disclosure may provide a simplified logic over a 15:1 unary encoder at least due to the symmetry of truth table 200. For example, as shown in truth table 210, outputs 8 through 15 may be removed. Next, outputs 7 through 1 may be copied to outputs 15 through 9 as shown in truth table 212. Then, as shown in truth table 214, output 8 may be connected to input 3 because, as can be seen in this example, output 8 is always the same as input 3. Encoding system 100 may be tied low using input 3 to obtain truth table 216. Next output 9 may be swapped with F, output A may be swapped with E, and output B may be swapped with D to obtain truth table 204. Accordingly, encoding system 100 may provide a logical equivalence of a 15:1 encoder by using only a 7:1 encoder. As can be seen from FIG. 2B, this reduction in encoder size may be achieved by exploiting the symmetric characteristic of the unary code in order to simplify implementation logic of embodiments of the disclosure.

Referring back to FIG. 1, an embodiment of the disclosure may comprise, for example, a 4 bit input-to-15 bit output gray code-to-unary code encoder. In this example, first stage 102 may comprise, but is not limited to, a 7:1 decoder. As shown in FIG. 1, first stage 102 may receive first input 106 comprising a 0th bit, a 1st bit, and a 2nd bit of input code 202. Then first stage 102 may decode first input 106. For example, for the values of the 0th bit, the 1st bit, and the 2nd bit of input code 202 shown in truth table 200, first stage 102 may decode them to the corresponding 7 outputs in columns 7 through 1 (for rows 0 through 7) or columns 9 through F (for rows 8 through 15) of output code 204. First stage 102 may then produce first output 108 comprising decoded first input 106 on seven output nodes on first stage 102 (e.g., comprising a 7:1 decoder). While FIG. 1 illustrates first output 108 being produced on only one output interface, this is done for simplification and first stage 102 may have any number of output nodes, for example, one for each bit in first output 108. In this example, the number of output nodes may comprise 7.

Second stage 104 may comprise a second stage input port that may receive a 3rd bit of input code 202 as second input 110. Consequently, second stage 104 may pass the values of column 3 of input code 202 out as values of column 8 of output code 204. As shown in FIG. 2A, these two columns may match in truth table 200.

As shown in FIG. 1, second stage 104 may comprise first plurality of two input port AND gates 114. Each one of first plurality of two input port AND gates 114 may have a first input port respectively connected to one of the seven output nodes of the 7:1 decoder (i.e., first stage 102) and a second input port connected to an inverse of the 3rd bit of the input code 202. Similarly, second stage 104 may comprise second plurality of two input port AND gates 116. Each one of second plurality of two input port AND gates 116 may have a first input port respectively connected to one of the seven output nodes of the 7:1 decoder and a second input port connected to the 3rd bit of input code 202. Consequently, in the example shown in FIG. 1, first plurality of two input port AND gates 114 may comprise seven two input port AND gates (e.g., illustrated by "x7" in FIG. 1). Similarly, second plurality of two input port AND gates 116 may comprise seven two input port AND gates (e.g., illustrated by "x7" in FIG. 1).

Second output 112 of second stage 104 may comprise a 15 bit output corresponding to the example shown in FIG. 1. For example, bits 1 through 7 of the 15 bit output (i.e., columns 1 through 7 of output code 204) may respectively correspond to outputs of first plurality of two input port AND gates 114, bits 9 through 15 of the 15 bit output (i.e., columns 9 through F of output code 204) may respectively correspond to outputs of second plurality of two input port AND gates 116, and bit 8 of the 15 bit output (i.e., column 8 of output code 204) may correspond to the second stage input port described above. AND gates are illustrated in FIG. 1, but other types of logic gates used in junction with other circuit elements such as buffers and inverters may be used consistent with embodiments of the disclosure.

Figure 3:
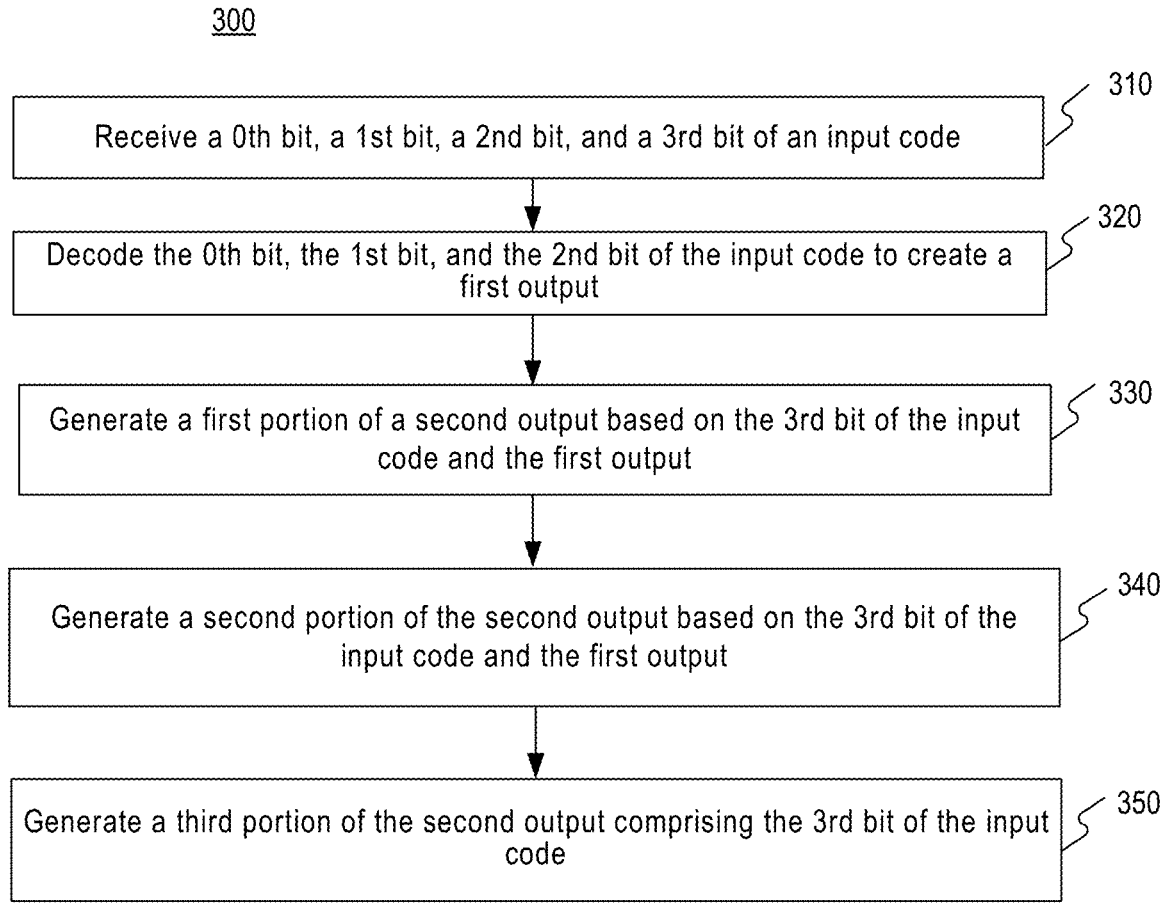
FIG. 3 is a flow chart of a method for providing encoding in accordance with some embodiments.

FIG. 3 is a flow chart setting forth the general stages involved in a method 300 consistent with an embodiment of the disclosure for providing encoding. Ways to implement the stages of method 300 will be described in greater detail below.

Illustrated method 300 begins and proceeds to an operation 310 where encoding system 100 may receive a 0th bit, a 1st bit, a 2nd bit, and a 3rd bit of an input code. For example, first stage 102 may receive first input 106 comprising a 0th bit, a 1st bit, and a 2nd bit of input code 202.

From the operation 310, where encoding system 100 receives the 0th bit, the 1st bit, the 2nd bit, and the 3rd bit of the input code, illustrated method 300 advances to an operation 320 where first stage 102 may decode the 0th bit, the 1st bit, and the 2nd bit of the input code to create first output 108. For example, for the values of the 0th bit, the 1st bit, and the 2nd bit of input code 202 shown in truth table 200, first stage 102 may decode them to the corresponding 7 outputs in columns 7 through 1 (for rows 0 through 7) or columns 9 through F (for rows 8 through 15) of output code 204.

Once first stage 102 decodes the 0th bit, the 1st bit, and the 2nd bit of the input code to create first output 108 in operation 320, method 300 may continue to an operation 330 where second stage 104 may generate first portion 122 of second output 112 based on the 3rd bit of the input code and first output 108. Then method 300 may continue to an operation 340 where second stage 104 may generate second portion 122 of second output 112 based on the 3rd bit of the input code and first output 108. Next, method 300 may continue to an operation 350 where second stage 104 may generate third portion 126 of second output 112 comprising the 3rd bit of the input code. Operation 330, operation 340, and operation 350 may be carried out at substantially the same time as described in more detail below.

For example, first stage 102 may produce first output 108 comprising decoded first input 106 on seven output nodes on first stage 102 (e.g., comprising a 7:1 decoder). Second stage 104 may receive second input 110. Second stage 104 may comprise a second stage input port that may receive a 3rd bit of input code 202 as second input 110. Consequently, second stage 104 may pass the values of column 3 of input code 202 out as values of column 8 of output code 204 as third portion 126 of second output 112. As shown in FIG. 2A, these two columns may match.

Second stage 104 may receive first output 108 from first stage 102. For example, each one of first plurality of two input port AND gates 114 may have a first input port respectively connected to one of the seven output nodes of the 7:1 decoder (i.e., first stage 102) and a second input port connected to an inverse of the 3rd bit of the input code 202. Similarly, second stage 104 may further comprise second plurality of two input port AND gates 116. Each one of second plurality of two input port AND gates 116 may have a first input port respectively connected to one of the seven output nodes of the 7:1 decoder and a second input port connected to the 3rd bit of input code 202.

Second stage 104 may convert first input 106 and second input 110 from a first coding system to a second coding system based on second input 110 and first output 108. For example, second output 112 of second stage 104 may comprise a 15 bit output corresponding to the example shown in FIG. 1. For example, bits 1 through 7 (i.e., first portion 122) of the 15 bit output (i.e., columns 1 through 7 of output code 204) may respectively correspond to outputs of first plurality of two input port AND gates 114, bits 9 through 15 (i.e., second portion 124) of the 15 bit output (i.e., columns 9 through F of output code 204) may respectively correspond to outputs of second plurality of two input port AND gates 116, and bit 8 (i.e., third portion 126) of the 15 bit output (i.e., column 8 of output code 204) may correspond to the second stage input port described above. Accordingly, second stage 104 may produce second output 112 comprising the converted first input 106 and the converted second input 110. Once second stage 104 produces second output 112 comprising the converted first input 106 and the converted second input 110, method 300 may then end.

Figure 4B:
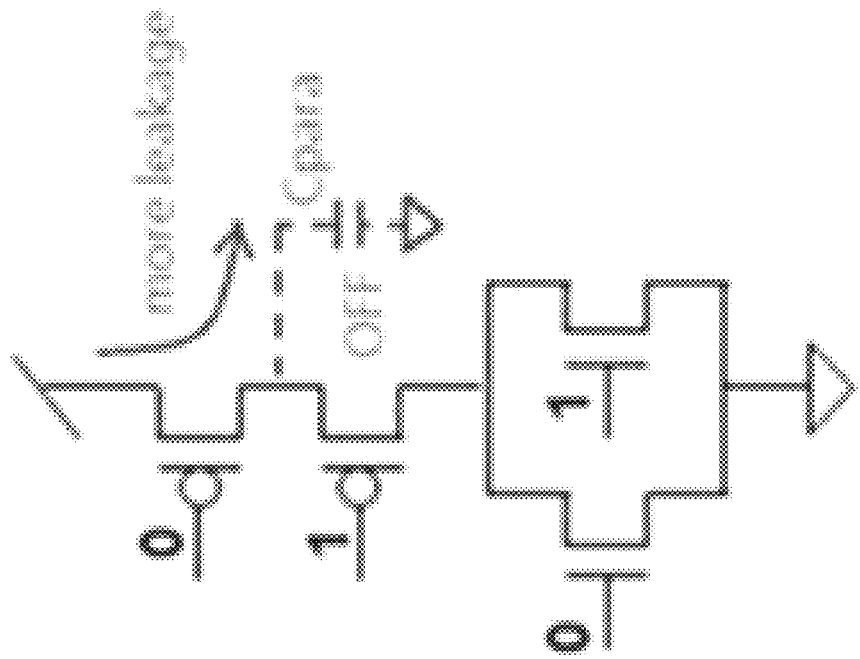
FIG. 4A and FIG. 4B illustrate swapping logic gate inputs using NOR2 gates to reduce the standby current of more commonly occurring cases in accordance with some embodiments.
Figure 4A:
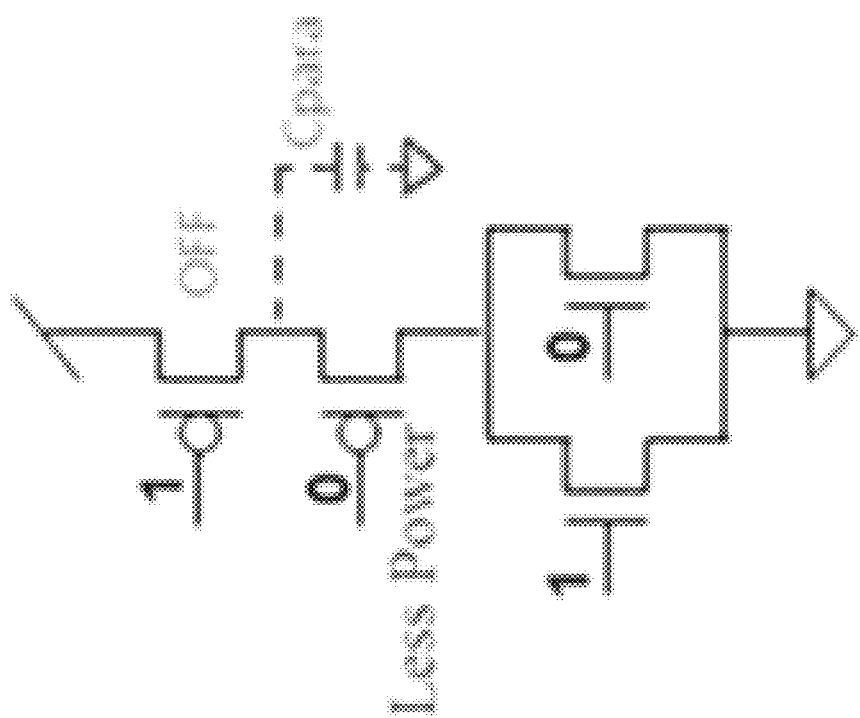

FIG. 4A and FIG. 4B illustrate swapping logic gate inputs to reduce the standby current of more commonly occurring cases. NOR2 gates are illustrated in FIG. 4A and FIG. 4B, but other types of logic gates may be used consistent with embodiments of the disclosure. As shown in FIG. 4A and FIG. 4B, the standby current of a NOR2 gate may depend on the input. If the topmost P-type metal-oxide-semiconductor (PMOS) transistor is turned off (FIG. 4A), the leakage current through parasitic capacitance between the two PMOS transistors to ground may be significantly less than that when the topmost PMOS transistor is turned on (FIG. 4B).

Figures 5A, 5B:
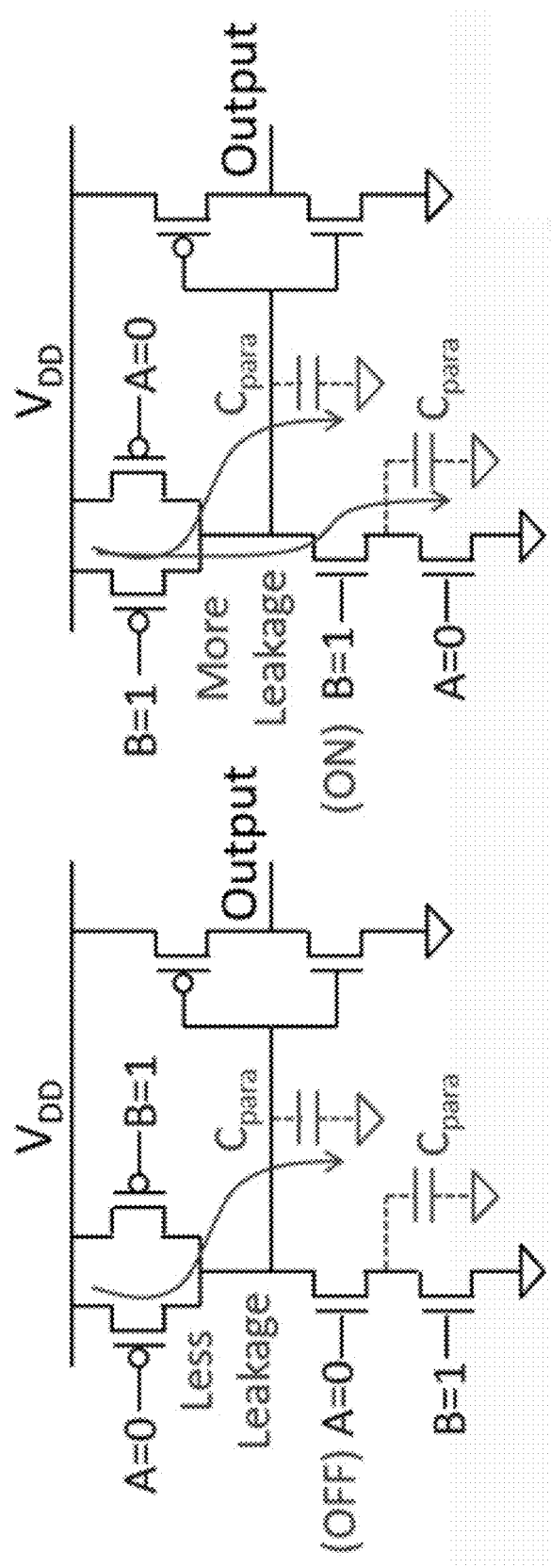
FIG. 5A and FIG. 5B illustrate swapping logic gate inputs using AND2 gates to reduce the standby current of more commonly occurring cases in accordance with some embodiments.

FIG. 5A and FIG. 5B illustrate swapping logic gate inputs to reduce the standby current of more commonly occurring cases. AND2 gates are illustrated in FIG. 5A and FIG. 5B, but other types of logic gates may be used consistent with embodiments of the disclosure. As shown in FIG. 5A and FIG. 5B, the standby current of an AND2 gate may depend on the input. If the upper N-type metal-oxide-semiconductor (NMOS) transistor is turned off (FIG. 5A), the leakage current through parasitic capacitance may be significantly less than that when the upper NMOS transistor is turned on (FIG. 5B), in which there may be two leakage paths.

In addition, by considering input distribution (e.g., a Gaussian trim code distribution), embodiments of the disclosure may swap the logic gate inputs to reduce the standby current of the more commonly occurring trim codes used in the SA trimming function of the MRAM. Embodiments of the disclosure may also swap logic gate inputs to favor default trim codes (i.e., optimize to favor trim codes near a default (e.g., 8)). In other words, embodiments of the disclosure may map the most commonly used trim codes to the states of encoding system 100 that have the lowest standby currents. Accordingly, embodiments of the disclosure may reduce SA trimming logic area by approximately 22% over conventional systems without any trimming resolution penalty. In addition, embodiments of the disclosure may reduce SA trimming logic standby currents by approximately 15.3% over conventional systems while preserving, for example, "gray-to-thermal" characteristics.

Figure 6B:
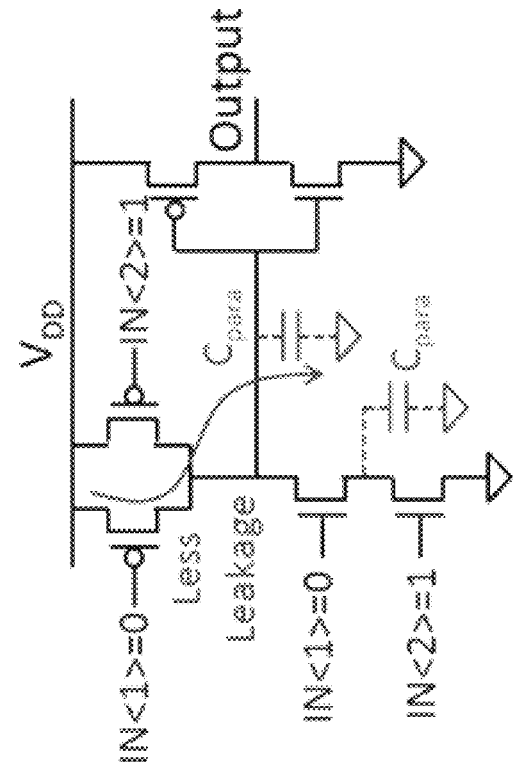
FIG. 6A and FIG. 6B illustrate swapping the logic gate inputs to reduce the standby current of the more commonly occurring trim codes used in a sense amplifier (SA) trimming function in accordance with some embodiments.
Figure 6A:
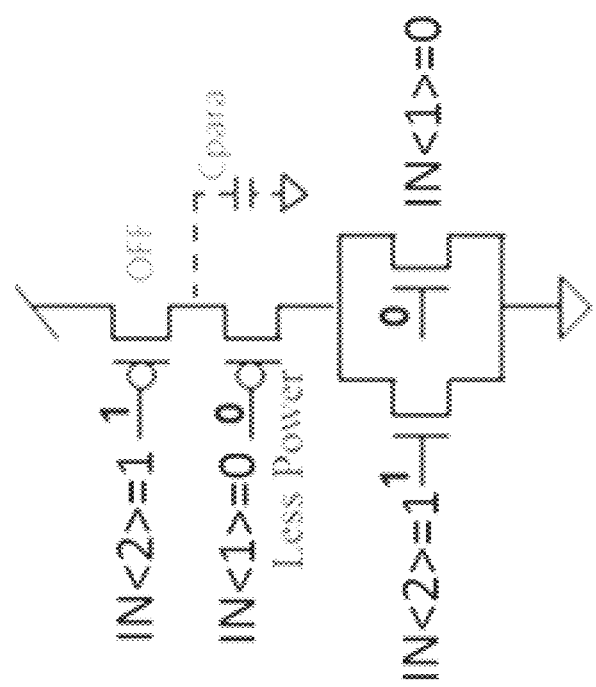

FIG. 6A and FIG. 6B illustrate swapping the logic gate inputs to reduce the standby current of the more commonly occurring trim codes used in the SA trimming function for example. Consistent with embodiments of the disclosure, TRIM code "7" and "8" may comprise the most frequently occurring cases. Taking TRIM code "8", for example, according to truth table 216, TRIM code "8" corresponds to IN<3:0>=1100. Because TRIM code "8" occurred most frequently, embodiments of the disclosure may re-arrange the inputs to logic gates accordingly to minimize energy. Consistent with embodiments of the disclosure, whenever IN<3:0> is connected to a logic gate, the inputs that correspond to zeroes (e.g., IN<1:0>) may be connected in the fashion illustrated in FIG. 6A and FIG. 6B for example. As shown in FIG. 6A, for OR-like logic gates (e.g., OR, NOR), inputs corresponding to zeroes may be connected to the PMOS transistor closer to the center node between the PMOS transistor and the NMOS transistor. As shown in FIG. 6B, for AND-like logic gates (e.g., AND, NAND), inputs corresponding to zeroes may be connected to the NMOS transistor closer to the center node between the PMOS transistor and the NMOS transistor. Accordingly, the logic gate inputs may be swapped to reduce the standby current of the more commonly occurring trim codes.

An embodiment of the disclosure may comprise, for example, a 4 bit input-to-15 bit output gray code-to-unary code encoder. Embodiments of the disclosure may exploit a symmetric characteristic of the unary code in order to simplify implementation logic of embodiments of the disclosure. Furthermore, embodiments of the disclosure may reduce standby currents as a result of the simplified logic. In addition, by considering input distribution, embodiments of the disclosure may swap logic gate inputs to reduce the standby current of the more commonly occurring trim codes used in the SA trimming function of the MRAM.

An embodiment of the disclosure may comprise an encoding system. The encoding system may comprise a first stage and a second stage. The first stage may be configured to receive a first input, decode the first input, and produce a first output comprising the decoded first input. The second stage may be configured to receive a second input, receive the first output from the first stage, and convert the first input and the second input from a first coding system to a second coding system based on the second input and the first output. The second stage may produce a second output comprising the converted first input and the converted second input.

Another embodiment of the disclosure may comprise an encoding system. The encoding system may comprise a first stage and a second stage. The first stage may comprise a 7:1 decoder configured to: i) receive a first input comprising a 0th bit, a 1st bit, and a 2nd bit of an input code; ii) decode the first input, and iii) produce a first output comprising the decoded first input on seven output nodes on the 7:1 decoder. The second stage may comprise a second stage input port configured to receive a 3rd bit of the input code. The second stage may further comprise a first plurality of two input port AND gates. Each one of the first plurality of two input port AND gates may have a first input port respectively connected to one of the seven output nodes of the 7:1 decoder and a second input port connected to an inverse of the 3rd bit of the input code. The second stage may further comprise a second plurality of two input port AND gates. Each one of the second plurality of two input port AND gates may have a first input port respectively connected to one of the seven output nodes of the 7:1 decoder and a second input port connected to the 3rd bit of the input code. The second stage may further comprise a 15 bit output where bits 1 through 7 of the 15 bit output respectively correspond to outputs of the first plurality of two input port AND gates, bits 9 through 15 of the 15 bit output respectively correspond to outputs of the second plurality of two input port AND gates, and bit 8 of the 15 bit output corresponds to the second stage input port.

Yet another embodiment of the disclosure may comprise a method for providing an encoder. Embodiments of the disclosure may comprise receiving, at a first stage, a first input, decoding, at the first stage, the first input, and producing, at the first stage, a first output comprising the decoded first input. Embodiments of the disclosure may further comprise receiving, at a second stage, a second input, receiving, at the second stage, the first output from the first stage, and converting, at the second stage, the first input and the second input from a first coding system to a second coding system based on the second input and the first output. Embodiments of the disclosure may further comprise producing, by the second stage, a second output comprising the converted first input and the converted second input.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An apparatus comprising:
   a first stage comprising a 7:1 decoder, wherein the 7:1 decoder decodes a first input to produce a first output; and
   a second stage configured to;
     receive the first output from the first stage,
     receive a second input,
     convert the first output and the second input from a first code to a second code based on the second input and the first output, and
     a first plurality of two input port AND gates, each one of the first plurality of two input port AND gates having a first input port respectively connected to one of seven output nodes of the 7:1 decoder and a second input port connected to an inverse of an input bit.

2. The apparatus of claim 1, wherein the first stage is configured to receive the first input.

3. The apparatus of claim 2, wherein the first stage is configured to decode the first input.

4. The apparatus of claim 3, wherein the first stage is configured to produce the first output comprising the decoded first input.

5. The apparatus of claim 1, wherein the first code comprises Binary.

6. The apparatus of claim 1, wherein the first code comprises Gray Code.

7. The apparatus of claim 1, wherein the second code comprises Unary Code.

8. The apparatus of claim 1, wherein the apparatus is further configured to produce a second output comprising the converted first output and the converted second input.

9. The apparatus of claim 1, wherein the apparatus is disposed in a Magnetoresistive Random Access Memory (MRAM).

10. The apparatus of claim 1, wherein the second stage comprises a plurality of logic gates.

11. The apparatus of claim 1, wherein the first output is smaller than the second output.

12. The apparatus of claim 1, wherein the second stage further comprises a second plurality of two input port AND gates, each one of the second plurality of two input port AND gates having a first input port respectively connected to one of seven output nodes of the 7:1 decoder and a second input port connected an input bit.

13. The apparatus of claim 12, wherein inputs to the first plurality of two input port AND gates and the second plurality of two input port AND gates are arranged to reduce standby current for more commonly occurring TRIM codes used in in a sense amplifier (SA) trimming function.

14. A method comprising:
   producing, by a first stage, a first output comprising a decoded first input, wherein the first stage comprises a 7:1 decoder;
   receiving, by a second stage, the first output from the first stage;
   receiving, by a second stage, a second input; and
   converting, by the second stage, the first output and the second input from a first code to a second code based on the second input and the first output, wherein the second stage comprises a first plurality of two input port AND gates, each one of the first plurality of two input port AND gates having a first input port respectively connected to one of seven output nodes of the 7:1 decoder and a second input port connected to an inverse of an input bit.

15. The method of claim 14, wherein the first code comprises Binary.

16. The method of claim 14, wherein the first code comprises Gray Code.

17. The method of claim 14, wherein the second code comprises Unary Code.

18. An apparatus configured to:
   receive a first input;
   produce a first output from the first input by decoding the first input using a 7:1 decoder of a first stage;
   receive a second input;
   convert the first output and the second input from a first code to a second code based on the second input and the first output at a second stage, wherein the second stage comprises a first plurality of two input port AND gates, each one of the first plurality of two input port AND gates having a first input port respectively connected to one of seven output nodes of the 7:1 decoder and a second input port connected to an inverse of an input bit; and
   provide the converted first output and second input to a trimming function of a Sense Amplifier.

19. The apparatus of claim 18, wherein the first code comprises one of Binary and gray code.

20. The apparatus of claim 18, wherein the second code comprises Unary Code.

* * * * *